United States Patent
Song

(10) Patent No.: US 8,502,193 B2
(45) Date of Patent: Aug. 6, 2013

(54) LIGHT-EMITTING DEVICE AND FABRICATING METHOD THEREOF

(75) Inventor: June O Song, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 52 days.

(21) Appl. No.: 12/988,437

(22) PCT Filed: Apr. 16, 2009

(86) PCT No.: PCT/KR2009/001991
§ 371 (c)(1), (2), (4) Date: Dec. 30, 2010

(87) PCT Pub. No.: WO2009/128669
PCT Pub. Date: Oct. 22, 2009

(65) Prior Publication Data
US 2011/0101304 A1    May 5, 2011

(30) Foreign Application Priority Data

Apr. 16, 2008 (KR) .................. 10-2008-0034933
May 4, 2008 (KR) .................. 10-2008-0041610

(51) Int. Cl.
*H01L 29/06* (2006.01)
*H01L 31/00* (2006.01)

(52) U.S. Cl.
USPC ............... 257/13; 257/15; 257/95; 257/96; 257/E33.067

(58) Field of Classification Search
None
See application file for complete search history.

(56) References Cited

U.S. PATENT DOCUMENTS

| 6,744,071 | B2 | 6/2004 | Sano et al. | |
|---|---|---|---|---|
| 2001/0035532 | A1* | 11/2001 | Ito et al. | 257/103 |
| 2007/0145392 | A1 | 6/2007 | Haberern et al. | |
| 2008/0081390 | A1* | 4/2008 | Gaska et al. | 438/37 |
| 2008/0093612 | A1* | 4/2008 | Konno et al. | 257/96 |
| 2008/0217635 | A1* | 9/2008 | Emerson et al. | 257/98 |
| 2008/0265267 | A1* | 10/2008 | Unno | 257/98 |
| 2009/0179190 | A1* | 7/2009 | Nakahara et al. | 257/13 |

FOREIGN PATENT DOCUMENTS

| JP | 11-340509 | 12/1999 |
|---|---|---|
| WO | WO 2006/080958 | 8/2006 |
| WO | WO 2007138656 A1 * | 12/2007 |

OTHER PUBLICATIONS

International Search Report issued in PCT/KR2009/001991 dated Nov. 26, 2009.

* cited by examiner

*Primary Examiner* — Benjamin Sandvik
*Assistant Examiner* — Leslie Pilar Cruz
(74) *Attorney, Agent, or Firm* — KED & Associates, LLP

(57) ABSTRACT

Disclosed are a light emitting device and a method of manufacturing the same. The light emitting device includes a support substrate, a wafer bonding layer over the support substrate, a second electrode layer, which includes a current blocking layer and a reflective current spreading layer, over the wafer bonding layer, a current injection layer over the second electrode layer, a superlattice structure layer over the current injection layer, a second conductive semiconductor layer over the superlattice structure layer, an active layer over the second conductive semiconductor layer, a first conductive semiconductor layer over the active layer, and a first electrode layer over the first conductive semiconductor layer.

20 Claims, 16 Drawing Sheets

LIGHT-EMITTING DEVICE AND FABRICATING METHOD THEREOF

TECHNICAL FIELD

The embodiment relates to a light emitting device and a method of manufacturing the same.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED includes a light emitting semiconductor layer including a first conductive semiconductor layer, an active layer and a second conductive semiconductor layer, in which the active layer generates light according to current applied to the first and second conductive semiconductor layers.

The LED may be classified into a lateral type LED and a vertical type LED.

According to the lateral type LED, the first conductive semiconductor layer, the active layer and the second conductive semiconductor layer are formed over a growth substrate, and the second conductive semiconductor layer, the active layer and the first conductive semiconductor layer are partially removed such that a portion of the first conductive semiconductor layer can be exposed to form an electrode layer. Thus, the light emitting area may be reduced so that the light efficiency may be degraded.

In addition, according to the lateral type LED, since the first conductive semiconductor layer, the active layer and the second conductive semiconductor layer are formed over the growth substrate having low thermal conductivity, the heat dissipation is not easy.

In contrast, according to the vertical type LED, a first electrode layer is formed over the first conductive semiconductor layer and a second electrode layer is formed under the second conductive semiconductor layer, so it is not necessary to remove the active layer to form the electrode layer. Thus, the light emitting area may not be reduced, so that the light efficiency may be improved as compared with that of the lateral type LED.

In addition, according to the vertical type LED, heat is transferred through the second electrode layer, so the heat dissipation is easy.

Although the vertical type LED has the advantages, several requirements sill remain in the vertical type LED and the lateral type LED.

First, in the LED, the light efficiency has to be increased by preventing a current flowing between the first and second electrodes from being concentrated over a specific region and allowing the current to be widely spread to increase the light emitting area.

Second, in the LED, since the second conductive semiconductor layer has relatively high sheet resistance due to low carrier concentration and mobility, a transparent current injection layer including ITO or ZnO is required to form an ohmic contact interface. However, the current injection layer including ITO or ZnO forms a schottky contact interface instead of the ohmic contact interface through the following processes such as deposition and heat treatment processes. Accordingly, the current injection layer forming the ohmic contact interface is required.

Third, in the vertical type LED, when the light emitting semiconductor layer is bonded to the conductive support substrate through a wafer bonding process, cracks or breakages may be caused in the light emitting semiconductor layer due to the difference in a thermal expansion coefficient between the light emitting semiconductor layer and the conductive support substrate. Accordingly, the wafer bonding process has to be performed at a temperature of less than 300° C. to minimize the thermal stress, so that it is difficult to perform the subsequent processes.

DISCLOSURE

Technical Problem

The embodiment provides a light emitting device having a novel structure and a method of manufacturing the same.

The embodiment provides a light emitting device capable of improving electrical characteristics and a method of manufacturing the same.

The embodiment provides a light emitting device capable of improving light efficiency and a method of manufacturing the same.

Technical Solution

According to the embodiment, the light emitting device includes a support substrate, a wafer bonding layer over the support substrate, a second electrode layer, which includes a current blocking layer and a reflective current spreading layer, over the wafer bonding layer, a current injection layer over the second electrode layer, a superlattice structure layer over the current injection layer, a second conductive semiconductor layer over the superlattice structure layer, an active layer over the second conductive semiconductor layer, a first conductive semiconductor layer over the active layer, and a first electrode layer over the first conductive semiconductor layer.

According to the embodiment, the light emitting device includes a support substrate, a wafer bonding layer over the support substrate, a current blocking layer partially formed over the wafer bonding layer, a reflective current spreading layer over the wafer bonding layer and the current blocking layer, a current injection layer provided over a top surface and a lateral surface of the reflective current spreading layer, a superlattice structure layer over a top surface and a lateral surface of the current injection layer, a second conductive semiconductor layer over the superlattice structure layer and the reflective current spreading layer, an active layer over the second conductive semiconductor layer, a first conductive semiconductor layer over the active layer, and a first electrode layer over the first conductive semiconductor layer.

ADVANTAGEOUS EFFECTS

The embodiment can provide a light emitting device having a novel structure and a method of manufacturing the same.

The embodiment can provide a light emitting device capable of improving electrical characteristics and a method of manufacturing the same.

The embodiment can provide a light emitting device capable of improving light efficiency and a method of manufacturing the same.

DESCRIPTION OF DRAWINGS

FIGS. 25 to 33 are sectional views showing a method of manufacturing a light emitting device according to the fifth embodiment;

BEST MODE

[Mode for Invention]

Figure 1:
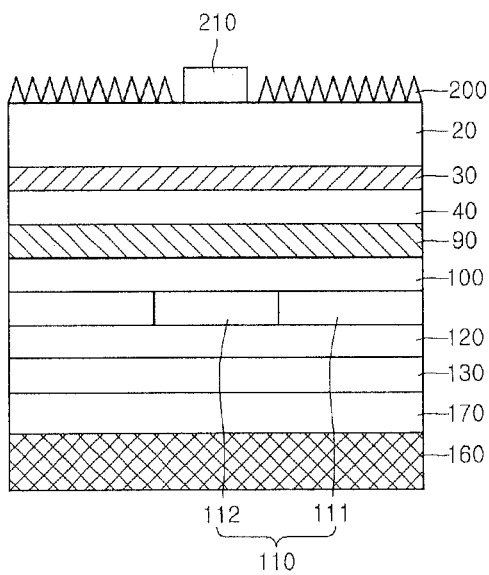
FIG. 1 is a sectional view showing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a sectional view showing a light emitting device according to a first embodiment.

Referring to FIG. 1, first and second wafer bonding layers 130 and 170 are formed over a support substrate 160, and a diffusion barrier layer 120 is formed over the first wafer bonding layer 130.

A second electrode layer 110 including a reflective current spreading layer 111 and a current blocking layer 112 is formed over the diffusion barrier layer 120, and a current injection layer 100 is formed over the second electrode layer 110.

In addition, a superlattice structure layer 90 is formed over the current injection layer 100, and a light emitting semiconductor layer including a second conductive semiconductor layer 40, an active layer 30, and a first conductive semiconductor layer 20 is formed over the superlattice structure layer 90.

In addition, a light extracting structure layer 200 and a first electrode layer 210 are formed over the first conductive semiconductor layer 20

In more detail, the support substrate 160 may include an electrical conductive thin film having a thickness of 10 μm or more through an electro-plating scheme a PVD (Physical Vapor Deposition) scheme, or a CVD (Chemical Vapor Deposition) scheme. For example, the support substrate 160 may include at least one selected from the group consisting of Cu, Ni, NiCu, NiCr, Nb, Au, Ta, Ti, and metallic silicide.

The first wafer bonding layer 130 and the second wafer bonding layer 170 may include an electrical conductive material that may have strong bonding strength at a temperature of about 300☐ to about 700☐. For example, the first wafer bonding layer 130 and the second wafer bonding layer 170 may include at least one selected from the group consisting of Au, Ag, Al, Rh, Cu, Ni, Ti, Pd, Pt, Cr, and metallic silicide.

The diffusion barrier layer 120 may selectively include various materials according to materials constituting the second electrode layer 110 and the first wafer bonding layer 130. For example, the diffusion barrier layer 120 may include at least one selected from the group consisting of Pt, Pd, Cu, Rh, Re, Ti, W, Cr, Ni, Si, Ta, TiW, TiNi, NiCr, TiN, WN, CrN, TaN, TiWN, and metallic silicide.

The second electrode 110 includes the current blocking layer 112 vertically overlapping with the first electrode layer 210 and the reflective current spreading layer 111 provided at a lateral side surface of the current blocking layer 112.

The current blocking layer 112 blocks a current applied from the outside from being concentrated over a specific region so that the current spreads widely, thereby increasing a light emitting area to increase light efficiency. The current blocking layer 112 may be placed corresponding to the first electrode layer 210, and may be divided into a plurality of layers. The current blocking layer 112 may include an electrical insulating thin film layer or a thin film layer of forming a schottky contact interface with the current injection layer 100. For example, the current blocking layer 112 may include at least one selected from the group consisting of an electrical conductive oxide layer including $SiN_x$, $SiO_2$, or $Al_2O_3$, Al, Ag, Rh, Ti, Cr, V, Nb, TiN, Cu, Ta, Au, Pt, Pd, Ru, and metallic silicide.

The reflective current spreading layer 111 may include an electrical conductive material having about 80% or more of the reflective rate with respect to a light of a wavelength of 600 nm or less. For example, the reflective current spreading layer 111 may include at least one selected from the group consisting of Al, Ag, Rh, Ti, Cr, V, Nb, TiN, Cu, Ta, Au, Pt, Pd, Ru, and metallic silicide.

The second electrode layer 110 including the reflective current spreading layer 111 and the current blocking layer 112 prevents a current from being concentrated and acts as a reflector for a light. In addition, the second electrode layer 110 has a multiple structure which prevents materials from being diffused, improves the bonding strength between materials, and prevents materials from being oxidized.

The current injection layer 100 may include a conductive thin film including a nitride or a carbon nitride including group II, III, or IV elements forming an ohmic contact interface with respect to the superlattice structure layer 90

For example, the current injection layer 100 may include a single layer structure or a multi-layer structure represented through a chemical formula of $In_xAl_yGa_{(1-x-y)}N$ ($0 \leq x$, $0 \leq y$, $x+y \leq 1$) and having a thickness of 6 nm or more.

The current injection layer 100 may be doped with Si, Mg, or Zn. For example, the current injection layer 100 may include GaN doped with Si or AlGaN doped with Si.

The superlattice structure layer 90 forms an ohmic contact interface with the second conductive semiconductor layer 40 so that current can be easily injected in a vertical direction. The superlattice structure layer 90 may increase the effective concentration of holes by reducing dopant activation energy of the second conducive semiconductor layer 40, or may cause a quantum mechanical tunneling conductive phenomenon through band-gap engineering.

The superlattice structure layer 90 may have a multiple structure including a nitride or a carbon nitride including group II, III, or IV elements, and each layer having the superlattice structure layer 90 may be formed at a thickness of 5 nm or less. Each layer having the superlattice structure layer 90 may include at least one selected from the group consisting of InN, InGaN, InAlN, AlGaN, GaN, AlInGaN, AlN, SiC, SiCN, MgN, ZnN, and SiN, and may be doped with Si, Mg, or Zn. For example, the superlattice structure layer 90 may have a multiple-layer structure such as InGaN/GaN, AlGaN/GaN, InGaN/GaN/AlGaN, or AlGaN/GaN/InGaN.

The superlattice structure layer 90 may have a single layer structure. For example, the superlattice structure layer 90 may be selected from the group consisting of an InGaN layer, a GaN layer, an AlInN layer, an AlN layer, an InN layer, an AlGaN layer, and an AlInGaN layer doped with N type impurities, or may be selected from the group consisting of an InGaN layer, a GaN layer, an AlInN layer, an AlN layer, an InN layer, an AlGaN, and an AlInGaN layer doped with P type impurities.

The light emitting semiconductor layer including the first conductive semiconductor layer 20, the active layer 30, and the second conductive semiconductor layer 40 may include a group III nitride-based semiconductor material. For example, the first conductive semiconductor layer 20 may include a gallium nitride-based layer doped with N type impurities such as Si, and the second conductive semiconductor layer 40 may include a gallium nitride layer including P type impurities such as Mg or Zn.

The active layer 30 generates a light through the recombination of electrons and holes. For example, the active layer 30 may include one selected from the group consisting of InGaN, AlGaN, GaN, and AlInGaN. The active layer 30 may be coated with Si or Mg. In addition, the wavelength of a light emitted from the light emitting device is determined according to the type of materials constituting the active layer 30.

The active layer 30 may include a multiple layer where well layers and barrier layers are repeatedly formed. The energy band gap of a material constituting the barrier layer is greater than the energy band gap of a material constituting the well layer. The thickness of the barrier layer may be thicker than the thickness of the well layer.

The light extracting structure layer 200 is formed in a concavo-convex structure over the first conductive semiconductor layer 20, and allows a light emitted from the active layer 30 to be effectively discharged to the outside. The light extracting structure layer 200 may be formed by selectively etching the first conductive semiconductor layer 20, or formed by forming an additional layer over the first conductive semiconductor layer 20 and then etching the resultant structure.

The first electrode layer 210 is formed over the first conductive semiconductor layer 20, and may include a material having the 50% or more of a reflective rate with respect to a light having a wavelength of about 600 nm or less. For example, the first electrode layer 210 may include at least one selected from the group consisting of Al, Ag, Rh, Ti, Cr, V, Nb, TiN, Cu, Ta, Au, Pt, Pd, Ru, and metallic silicide.

Although not shown, a passivation layer may be formed at a lateral surface of the light emitting semiconductor layer. For example, the passivation layer may include an electrical insulating oxide including $SiN_x$, $SiO_2$, or $Al_2O_3$.

Figure 2:
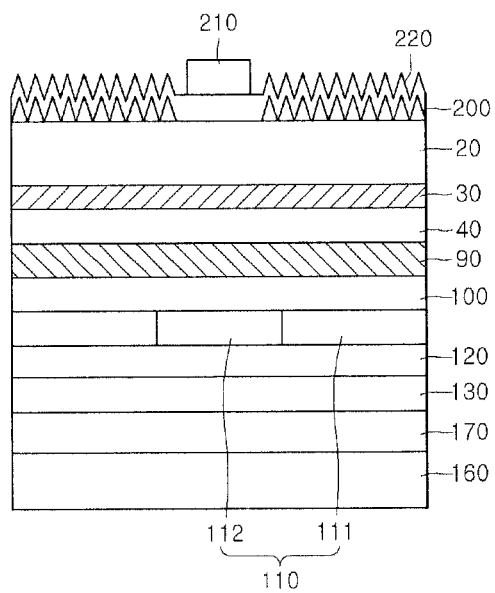
FIG. 2 is a sectional view showing a light emitting device according to a second embodiment.

FIG. 2 is a sectional view showing a light emitting device according to a second embodiment.

The light emitting device according to the second embodiment shown in FIG. 2 has a structure similar to that of the light emitting device according to the first embodiment. Accordingly, the light emitting device according to the second embodiment will be described while focusing over the difference from the first embodiment in order to avoid redundancy.

In the light emitting device according to the second embodiment, after forming a first ohmic contact electrode layer 220 over the first conductive semiconductor layer 20 and the light extracting structure layer 200, the first electrode layer 210 is formed over the first ohmic contact electrode layer 220.

The first ohmic contact electrode layer 220 is provided over a top surface thereof with a concavo-convex structure so that the light emitted from the active layer 30 can be effectively extracted to the outside.

The first ohmic contact electrode layer 220 forms an ohmic contact interface with respect to the first conductive semiconductor layer 20 and has the 70% or more of the light transmittance with respect to the wavelength of about 600 nm or less.

For example, the first ohmic contact electrode layer 220 may include at least one selected from the group consisting of TiN, TiO, ITO, ZnO, $RuO_2$, $IrO_2$, $In_2O_3$, $SnO_2$, ZnGaO, InZnO, ZnInO, and Ni—O—Au.

FIGS. 3 to 11 are sectional views showing a method of manufacturing the light emitting device according to the first embodiment.

Figure 3:
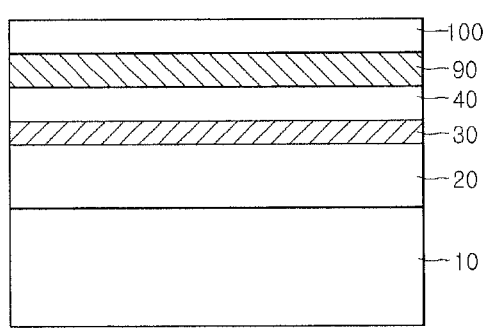
FIGS. 3 to 11 are sectional views showing a method of manufacturing a light emitting device according to the first embodiment.

Referring to FIG. 3, the light emitting semiconductor layer including the first conductive semiconductor layer 20, the active layer 30, and the second conductive semiconductor layer 40 is formed over a growth substrate 10. The superlattice structure layer 90 and the current injection layer 100 are formed over the second conductive semiconductor layer 40.

For example, the growth substrate 10 may include one selected from the group consisting of $Al_2O_3$, SiC, Si, AlN, GaN, AlGaN, glass, and GaAs.

Although not shown, a buffer layer may be formed between the growth substrate 10 and the first conductive semiconductor layer 20, and the buffer layer is formed over the growth substrate 10 in order to improve lattice match between the growth substrate 10 and the first conductive semiconductor layer 20. For example, the buffer layer may include at least one selected from the group consisting of InGaN, AlN, SiC, SiCN, and GaN.

The light emitting semiconductor layer may be formed over the buffer layer through an MOCVD or an MBE single crystal growth scheme. For example, the first conductive semiconductor layer 20 may include a GaN layer or an AlGaN layer doped with Si, and the active layer 30 may include an InGaN layer and a GaN layer that are undoped. The second conductive semiconductor layer 40 may include a GaN layer or an AlGaN layer doped with Mg.

The superlattice structure layer 90 and the current injection layer 100 form an ohmic contact interface with respect to the second conductive semiconductor layer 40, such that a current can be easily injected in a vertical direct. In addition, the superlattice structure layer 90 and the current injection layer 100 can prevent a material constituting the second electrode layer 110 from being diffused into the light emitting semiconductor layer. For example, the superlattice structure layer 90 may include an InGaN layer/a GaN layer doped with Si. The InGa layer/GaN layer may have a thickness of about 5 nm or less. In addition, the current injection layer 100 may include a GaN layer doped with Mg, and the GaN layer may have a thickness of about 6 nm or more.

Figure 4:
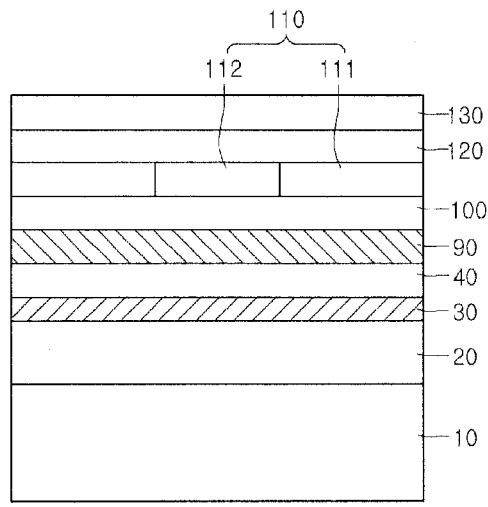

Referring to FIG. 4, the second electrode layer 110 including the reflective current spreading layer 111 and the current blocking layer 112 is formed over the current injection layer 100. In addition, the diffusion barrier layer 120 and the first wafer bonding layer 130 are formed over the second electrode layer 110.

For example, the reflective current spreading layer 111 may include Ag or alloy including Ag. The current blocking layer 112 may include an electrical insulating oxide layer including $SiN_x$, $SiO_2$, or $Al_2O_3$.

The diffusion barrier layer 120 prevents materials from being diffused between the second electrode layer 110 and the first wafer bonding layer 130. For example, the diffusion barrier layer 120 may include TiW or TiWN.

The first wafer bonding layer 130 may include Au or alloy including Au that is an electrical conductive material having a strong bonding strength at a temperature of about 300° C. or more with a predetermined pressure.

Figure 5:
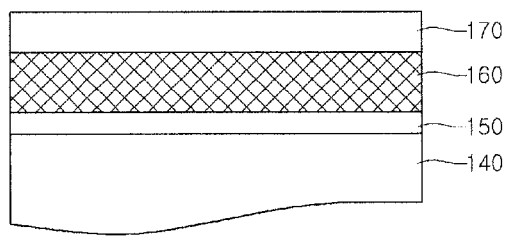

Referring to FIG. 5, a temporary substrate 140 is prepared, and a sacrificial separate layer 150, a support substrate 160, and a second wafer bonding layer 170 are formed over the temporary substrate 140.

The temporary substrate 140 may have a thermal expansion coefficient the same as or approximate to that of the growth substrate 10. The temporary substrate 150 prevents cracks or breakages from occurring in the light emitting semiconductor layer due to the difference in a thermal expansion coefficient between the growth substrate 10 and the support substrate 160 in the wafer bonding process to be described. In other words, the temporary substrate 140 and the growth substrate 10 are arranged while interposing the support substrate 160 between the temporary substrate 140 and the growth substrate 10. In other words, materials having the same thermal expansion coefficient or the approximate thermal expansion coefficient are symmetrical to each other, so that the growth substrate 10 is prevented from being bent.

For example, similarly to the growth substrate 10, the temporary substrate 140 may include one selected from the group consisting of $Al_2O_3$, SiC, Si, AlN, GaN, AlGaN, glass, and GaAs.

The sacrificial separate layer 150 may be include a material which is subject to a thermo-chemical decomposition reaction using a CMP (Chemical Mechanical Polishing) scheme, a chemical wet etching scheme, or a photon beam. For example, the sacrificial separate layer 150 may include one selected from the group consisting of InGaN, ZnO, and GaN.

For example, the support substrate 160 may have a single layer structure or a multiple layer structure including metal, alloy, or solid solution. The second wafer bonding layer 170 may include Au or alloy including Au.

Figure 6:
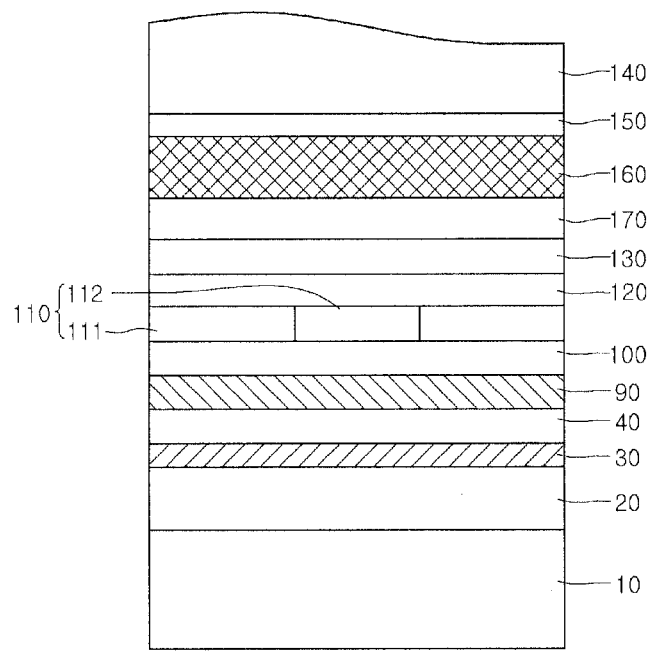

Referring to FIG. 6, the structure of FIG. 4 is bonded to the structure of FIG. 5 through the wafer bonding process, thereby forming a complex structure.

In other words, the first wafer bonding layer 130 is bonded to the second wafer bonding layer 170, thereby forming the complex structure.

The wafer bonding process may be performed under the conditions of the normal temperature or the temperature of 700☐ or under and hydrostatic pressure at a vacuum, oxygen, argon, or nitrogen atmosphere.

Prior to the wafer bonding process, a surface treatment process or a heat treatment process may be performed in order to improve a mechanical bonding strength or an ohmic contact interface between the first and second wafer bonding layers 130 and 170.

Figure 7:
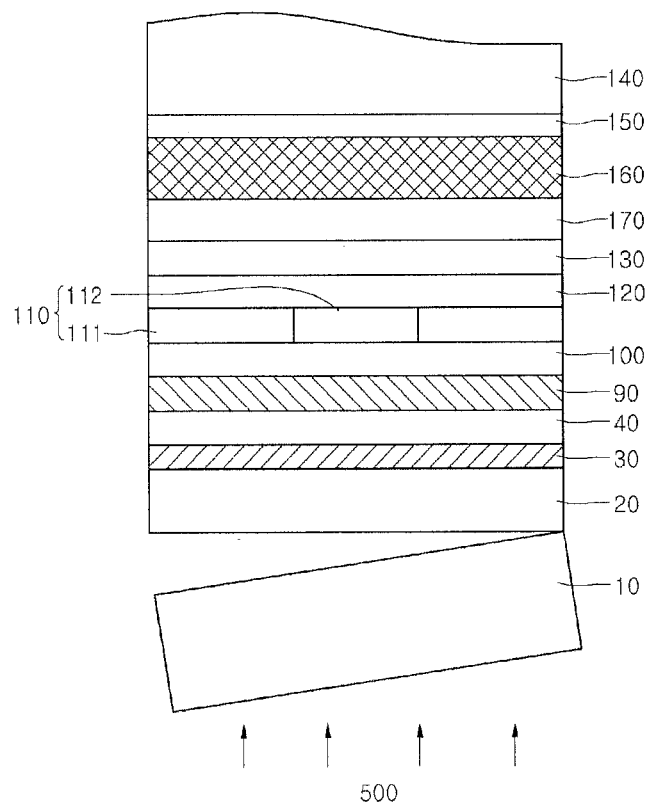

Referring to FIG. 7, the growth substrate 10 is separated from the complex structure of FIG. 6.

For example, if the growth substrate 10 includes an optically-transparent substrate such as a sapphire substrate or an AlN substrate causing thermo-chemical decomposition reaction is used, a photon beam 500 is irradiated to the growth substrate 10, so that the growth substrate 10 can be separated from the complex structure.

Figure 8:
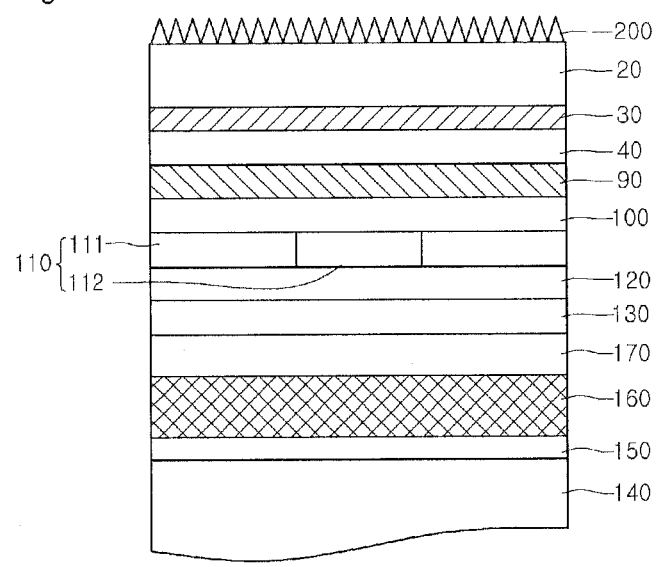

Referring to FIG. 8, after removing the growth substrate 10, the light extracting structure layer 200 is formed over the first conductive semiconductor layer 20.

The light extracting structure layer 200 may be formed by forming a concavo-convex structure over the surface of the first conductive semiconductor layer 20 through a wet etching process or a dry etching process for the first conductive semiconductor layer 20.

Figure 9:
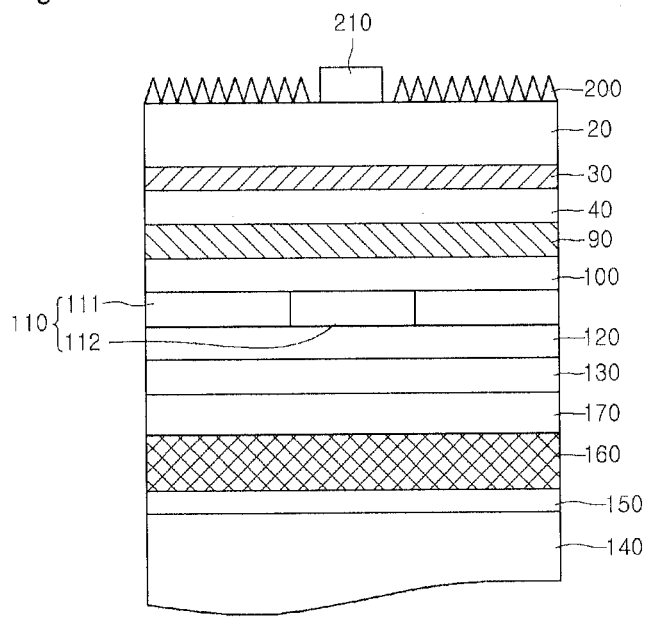

Referring to FIG. 9, the first electrode layer 210 is formed over the first conductive semiconductor layer 20.

The first electrode layer 210 may vertically overlaps with the current blocking layer 112. For example, the first electrode layer 210 may include the stack structure of Cr/Al/Cr/Au.

Figure 10:
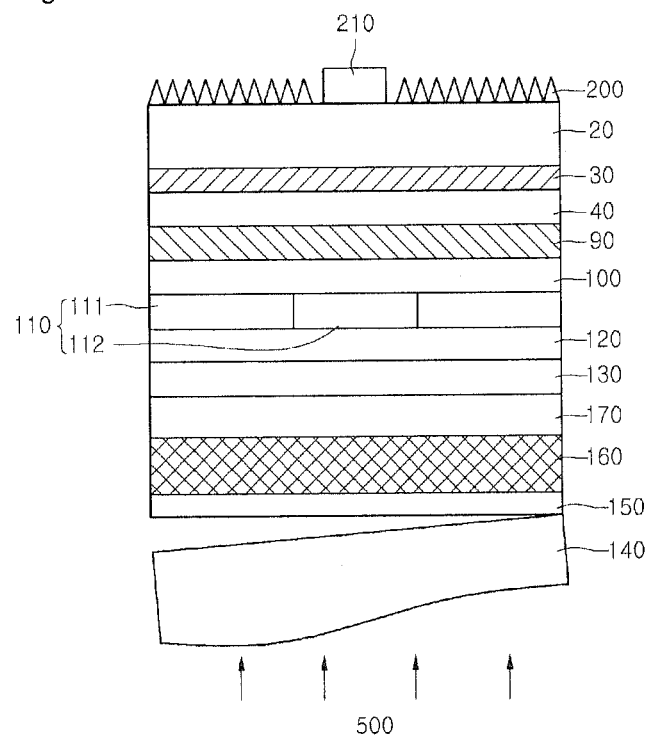
Figure 11:
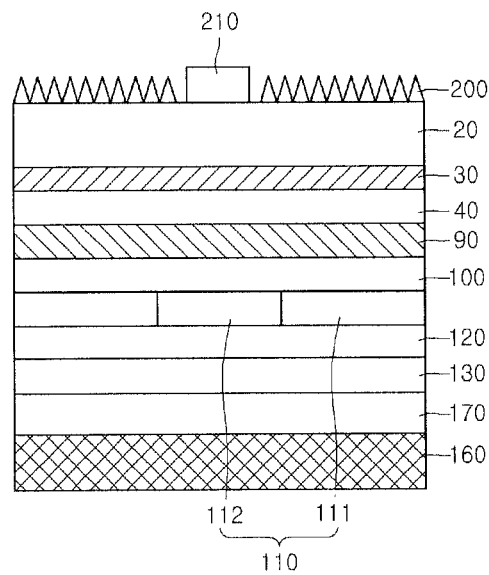

Referring to FIGS. 10 and 11, the temporary substrate 140 is separated from the resultant structure of FIG. 9.

Similarly to the growth substrate 10, the temporary substrate 140 can be separated through a thermo-chemical decomposition reaction by using the photon beam 500. In this case, the sacrificial separate layer 150 is decomposed and removed through the thermo-chemical decomposition reaction.

Therefore, the light emitting device according to the first embodiment can be manufactured as shown in FIG. 11.

Meanwhile, a method of manufacturing a light emitting device according to the second embodiment is similar to the method of manufacturing the light emitting device according to the first embodiment.

However, in FIG. 9, after the first ohmic contact electrode layer 220 has bee formed over the first conductive semiconductor layer 20 and the light extracting structure layer 200, the first electrode layer 210 is formed over the first ohmic contact electrode layer 220.

For example, the first ohmic contact electrode layer 220 may include one selected from the group consisting of ITO, InZnO, and ZnInO, and the first electrode layer 210 may have a stack structure of Ag/Ti/Pt/Au.

Figure 12:
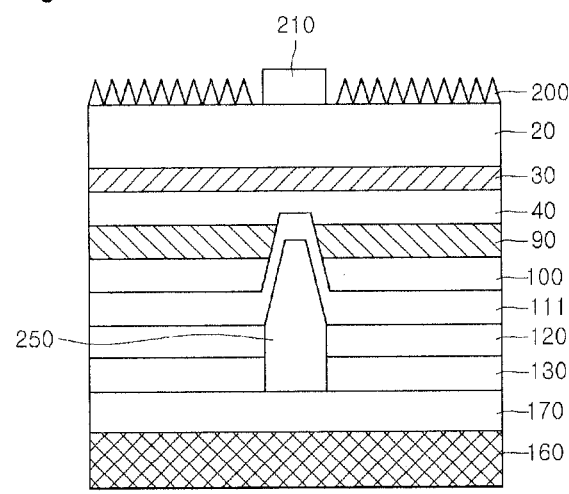
FIG. 12 is a sectional view showing a light emitting device according to a third embodiment.

FIG. 12 is a sectional view showing a light emitting device according to a third embodiment.

The light emitting device according to the third embodiment will be described while focusing over the difference from the first embodiment in order to avoid redundancy.

Referring to FIG. 12, the second wafer bonding layer 170 is formed over the support substrate 160, and a current blocking layer 250 and the first wafer bonding layer 130 are formed over the second wafer bonding layer 170. In addition, the diffusion barrier layer 120 is formed over the first wafer bonding layer 130.

The first wafer bonding layer 130 and the diffusion barrier layer 120 are arranged at a lateral surface of the current blocking layer 250.

The reflective current spreading layer 111 is formed over the diffusion barrier layer 120 and the current blocking layer 250, and the current injection layer 100 is partially formed over the reflective current spreading layer 111. The current injection layer 100 is formed over the top surface and the lateral surface of the reflective current spreading layer 111.

The superlattice structure layer 90 is formed over the current injection layer 100. In addition, the superlattice structure layer 90 is provided at the lateral surface of the reflective current spreading layer 111.

The light emitting semiconductor layer including the second conductive semiconductor layer 40, the active layer 30, and the first conductive semiconductor layer 20 is formed over the superlattice structure layer 90 and the reflective current spreading layer 111.

In addition, the light extracting structure layer 200 and the first electrode layer 210 are formed over the first conductive semiconductor layer 20

Meanwhile, the current blocking layer 250 is formed over the second wafer bonding layer 170 while extending to the superlattice structure layer 90. The current blocking layer 250 vertically overlaps with the first electrode layer 210. For example, the current blocking layer 250 may include an electrical insulating material such as air, $SiN_x$, $SiO_2$, or $Al_2O_3$.

A portion of the reflective current spreading layer 111 is formed over the current blocking layer 250, passes through the superlattice structure layer 90, and makes contact with the second conductive semiconductor layer 40.

The reflective current spreading layer 111 forms a schottky contact interface with respect to the second conductive semiconductor layer 40 and the superlattice structure layer 90, and forms an ohmic contact interface with respect to the current injection layer 100. For example, the reflective current spreading layer 111 may include at least one selected from the group consisting of Al, Ag, Rh, Ti, Cr, V, Nb, TiN, Cu, Ta, Au, Pt, Pd, Ru, and metallic silicide.

The current blocking layer 250 and the reflective current spreading layer 111 prevent the current applied from the outside from being concentrated and allow the current to be widely spread, thereby increasing a light emitting area to increase light efficiency.

Figure 13:
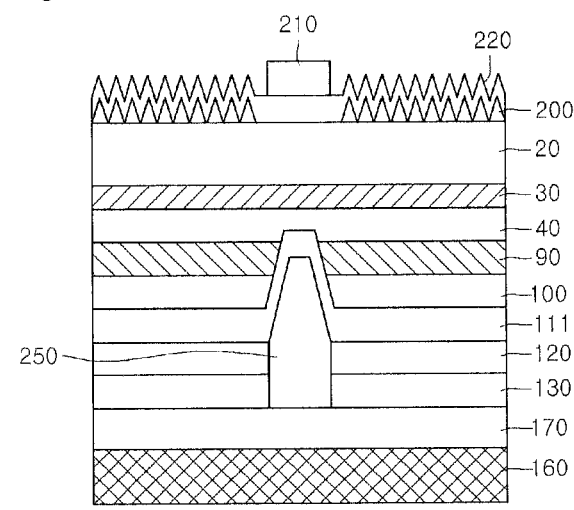
FIG. 13 is a sectional view showing a light emitting device according to a fourth embodiment.

FIG. 13 is a sectional view showing a light emitting device according to a fourth embodiment.

The light emitting device according to the fourth embodiment shown in FIG. 13 has a structure similar to that of the light emitting device according to the third embodiment. Accordingly, the light emitting device according to the fourth embodiment will be described while focusing over the difference from the third embodiment in order to avoid redundancy.

In the light emitting device according to the fourth embodiment, the first ohmic contact electrode layer 220 is formed over the first conductive semiconductor layer 20 and the light extracting structure layer 200, and the first electrode layer 210 is formed over the first ohmic contact electrode layer 220.

The first ohmic contact electrode layer 220 is provided over the top surface thereof with a concavo-convex structure so that the light emitted from the active layer 30 can be effectively extracted to the outside.

The first ohmic contact electrode layer 220 forms an ohmic contact interface with respect to the first conductive semiconductor layer 20 and has the 70% or more of the light transmittance with respect to a light having the wavelength of about 600 nm or less.

For example, the first ohmic contact electrode layer 220 may include at least one selected from the group consisting of TiN, TiO, ITO, ZnO, $RuO_2$, $IrO_2$, $In_2O_3$, $SnO_2$, ZnGaO, InZnO, ZnInO, and Ni—O—Au.

FIGS. 14 to 23 are sectional views showing the method of manufacturing the light emitting device according to the third embodiment. The method of manufacturing the light emitting device according to the third embodiment will be described while focusing over the difference from the light emitting device according to the first embodiment in order to avoid redundancy.

Figure 14:
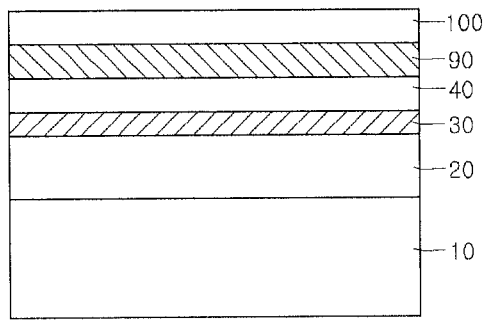
FIGS. 14 to 23 are sectional views showing a method of manufacturing THE light emitting device according to the third embodiment.

Referring to FIG. 14, the light emitting semiconductor layer including the first conductive semiconductor layer 20, the active layer 30, and the second conductive semiconductor layer 40 is formed over the growth substrate 10. The superlattice structure layer 90 and the current injection layer 100 are formed over the second conductive semiconductor layer 40.

Figure 15:
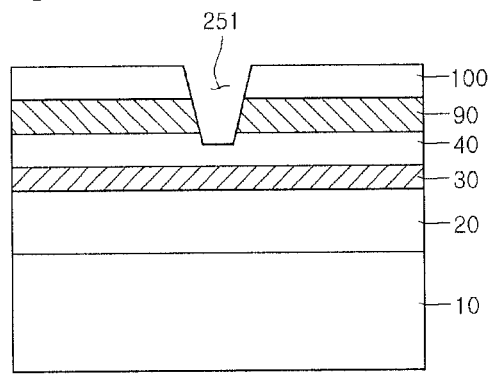

Referring to FIG. 15, the current injection layer 100, the superlattice structure layer 90, and the second conductive semiconductor layer 40 are selectively removed to form a groove part 251.

The second conductive semiconductor layer 40 is partially exposed through the groove part 251.

Figure 16:
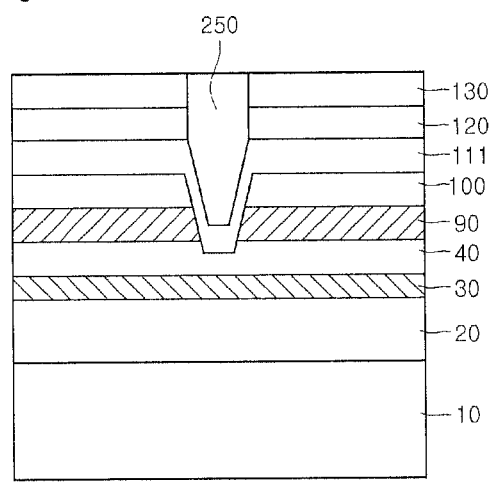

Referring to FIG. 16, the reflective current spreading layer 111 is formed over the current injection layer 100 including the groove part 251, and the diffusion barrier layer 120 and the first wafer bonding layer 130 are formed over the reflective current spreading layer 111 such that the groove part 251 can be exposed.

The reflective current spreading layer 111 forms a schottky contact interface with respect to the second conductive semiconductor layer 40 and the superlattice structure layer 90, and forms an ohmic contact interface with respect to the current injection layer 100.

In addition, the current blocking layer 250 is formed in the groove part 251.

Figure 17:
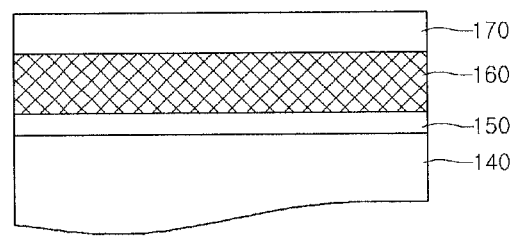

Referring to FIG. 17, the temporary substrate 140 is prepared, and the sacrificial separate layer 150, the support substrate 160, and the second wafer bonding layer 170 are formed over the temporary substrate 140.

Figure 18:
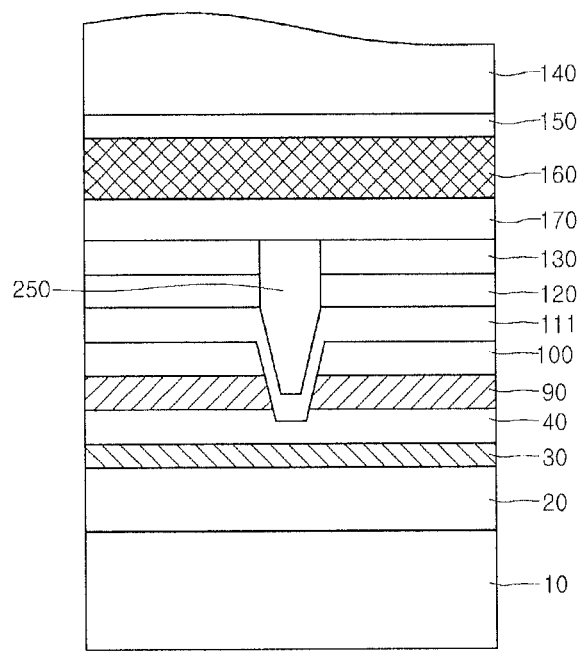

Referring to FIG. 18, the structure of FIG. 16 is bonded to the structure of FIG. 17 through the wafer bonding process, thereby forming a complex structure.

In other words, the first wafer bonding layer 130 is bonded to the second wafer bonding layer 170, thereby forming the complex structure.

Figure 19:
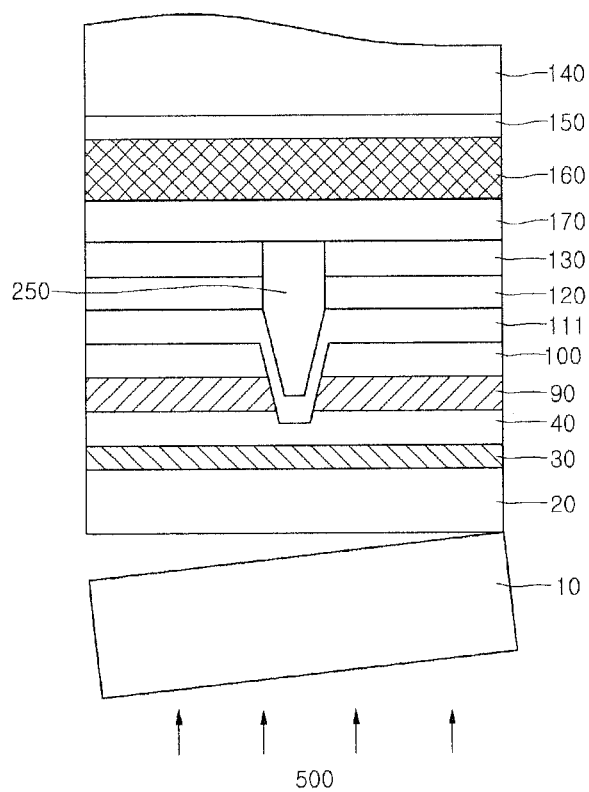

Referring to FIG. 19, the growth substrate 10 is separated from the complex structure shown in FIG. 18.

For example, if the growth substrate 10 includes an optically-transparent substrate such as a sapphire substrate or an AlN substrate causing thermo-chemical decomposition reaction is used, the photon beam 500 is irradiated to the growth substrate 10, so that the growth substrate 10 can be separated from the complex structure.

Figure 20:
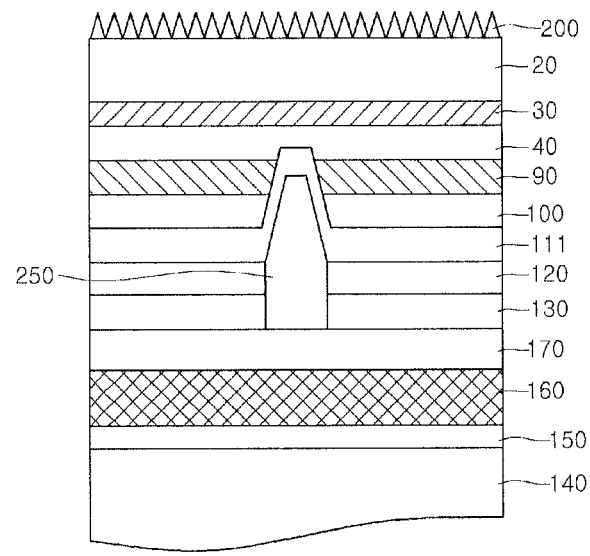

Referring to FIG. 20, after the growth substrate 10 has been removed, the light extracting structure layer 200 is formed over the first ohmic contact electrode layer 220.

Figure 21:
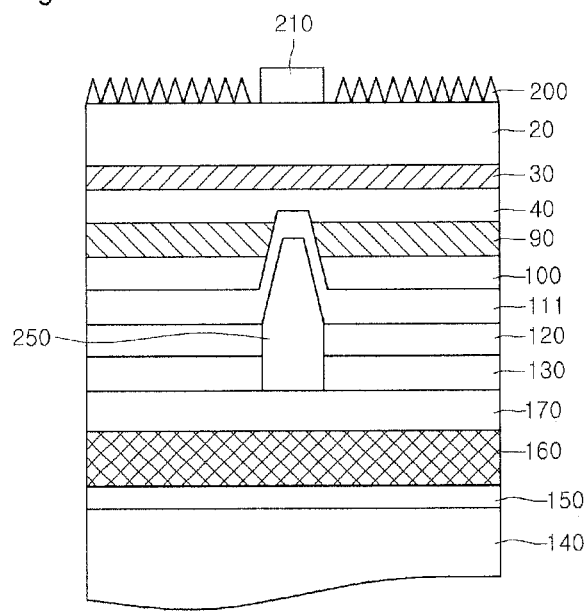

Referring to FIG. 21, the first electrode layer 210 is formed over the first conductive semiconductor layer 20.

The first electrode layer 210 may vertically overlap with the current blocking layer 250. For example, the first electrode layer 210 may have the stack structure of Cr/Al/Cr/Au.

Figure 22:
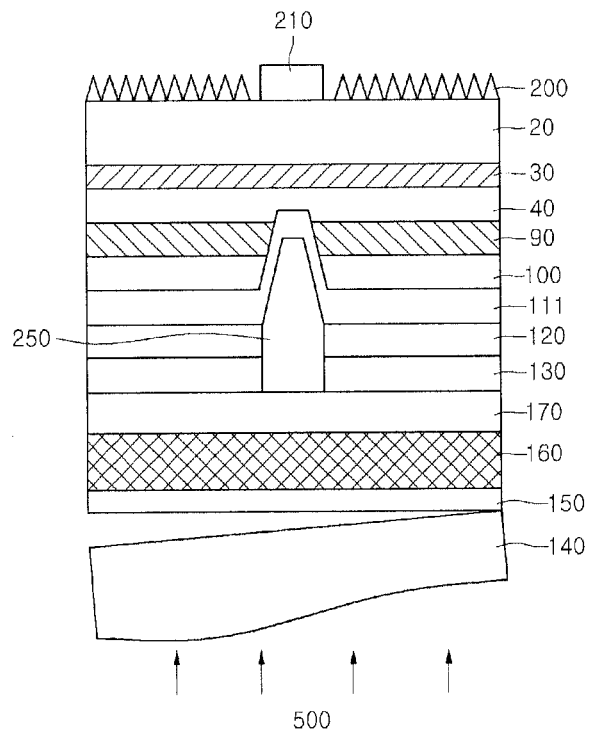
Figure 23:
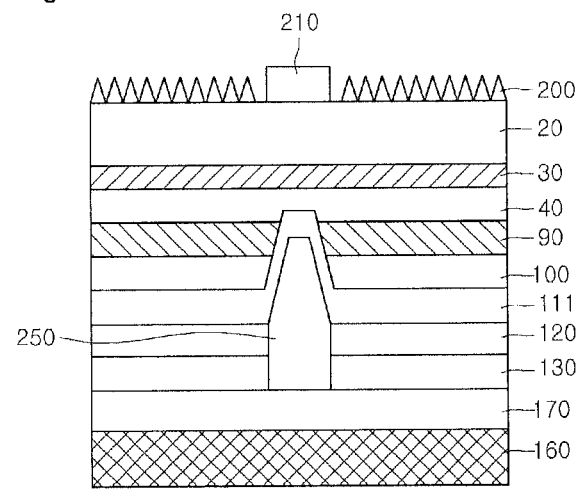

Referring to FIGS. 22 and 23, the temporary substrate 140 is separated from the structure of FIG. 21.

Similarly to the growth substrate 10, the temporary substrate 140 can be separated through a thermo-chemical decomposition reaction by using the photon beam 500. In this case, the sacrificial separate layer 150 is decomposed and removed through the thermo-chemical decomposition reaction.

Therefore, the light emitting device according to the fourth embodiment shown in FIG. 23 can be manufactured.

Meanwhile, the method of manufacturing the light emitting device according to the fourth embodiment is similar to the method of manufacturing the light emitting device according to the third embodiment.

However, in FIG. 21, after the first ohmic contact electrode layer 220 has bee formed over the first conductive semiconductor layer 20 and the light extracting structure layer 200, the first electrode layer 210 is formed over the first ohmic contact electrode layer 220.

For example, the first ohmic contact electrode layer 220 may include one of ITO, InZnO, and ZnInO, and the electrode layer 210 may have a stack structure of Ag/Ti/Pt/Au.

Figure 24:
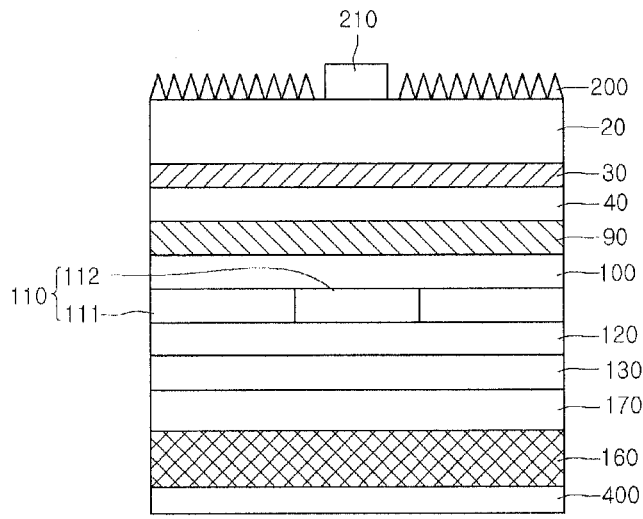
FIG. 24 is a sectional view showing a light emitting device according to a fifth embodiment.

FIG. 24 is a sectional view showing a light emitting device according to a fifth embodiment.

The light emitting device according to the fifth embodiment shown in FIG. 24 has a structure similar to that of the light emitting device according to the first embodiment. Accordingly, the light emitting device according to the fifth embodiment will be described while focusing over the difference from the first embodiment in order to avoid redundancy.

Referring to FIG. 24, the support substrate 160 is formed over a second ohmic contact electrode 400, and the first and second wafer bonding layers 130 and 170 are formed over the support substrate 160. In addition, the diffusion barrier layer 120 is formed over the first wafer bonding layer 130.

The second electrode layer 110 including the reflective current spreading layer 111 and the current blocking layer 112 is formed over the diffusion barrier layer 120, and the current injection layer 100 is formed over the second electrode layer 110.

In addition, the superlattice structure layer 90 is formed over the current injection layer 100, and the light emitting semiconductor layer including the second conductive semiconductor layer 40, the active layer 30, and the first conductive semiconductor layer 20 is formed over the superlattice structure layer 90.

In addition, the light extracting structure layer 200 and the first electrode layer 210 are formed over the first conductive semiconductor layer 20

Similarly to the first embodiment, the support substrate 160 may include a metallic plate or a foil including one selected from the group consisting of Cu, Ni, NiCu, NiCr, Nb, Au, Ta, and Ti, or may include a wafer including one selected from the group consisting of Si, GaAs, Ge, SiGe, AlN, GaN, AlGaN, SiC, and AlSiC.

Figure 25:
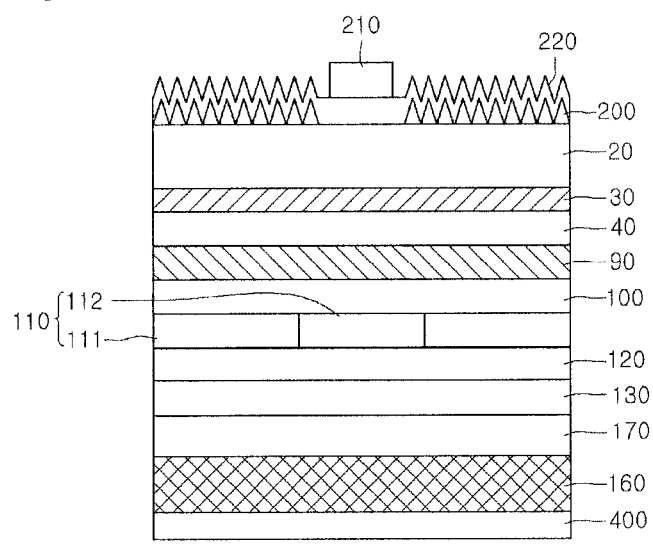
FIG. 25 is a sectional view showing a light emitting device according to a sixth embodiment.

FIG. 25 is a sectional view showing a light emitting device according to a sixth embodiment.

The light emitting device according to the sixth embodiment shown in FIG. 25 has a structure similar to that of the light emitting device according to the fifth embodiment. Accordingly, the light emitting device according to the sixth embodiment will be described while focusing over the difference from the fifth embodiment in order to avoid redundancy.

In the light emitting device according to the sixth embodiment, the first ohmic contact electrode layer 220 is formed over the first conductive semiconductor layer 20 and the light extracting structure layer 200, and the first electrode layer 210 is formed over the first ohmic contact electrode layer 220.

The first ohmic contact electrode layer 220 is provided over the top surface thereof with a concavo-convex structure so that the light emitted from the active layer 30 can be effectively extracted to the outside.

The first ohmic contact electrode layer 220 forms an ohmic contact interface with respect to the first conductive semiconductor layer 20 and has the 70% or more of the light transmittance with respect to a light having the wavelength of about 600 nm or less.

For example, the first ohmic contact electrode layer 220 may include at least one selected from the group consisting of TiN, TiO, ITO, ZnO, $RuO_2$, $IrO_2$, $In_2O_3$, $SnO_2$, ZnGaO, InZnO, ZnInO, and Ni—O—Au.

FIGS. 26 to 33 are sectional views showing the method of manufacturing the light emitting device according to the fifth embodiment. The method of manufacturing the light emitting device according to the fifth embodiment will be described while focusing over the difference from the light emitting device according to the first embodiment in order to avoid redundancy.

Figure 26:
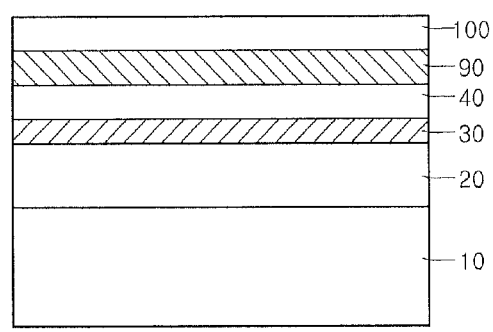

Referring to FIG. 26, the light emitting semiconductor layer including the first conductive semiconductor layer 20, the active layer 30, and the second conductive semiconductor layer 40 is formed over the growth substrate 10. The superlattice structure layer 90 and the current injection layer 100 are formed over the second conductive semiconductor layer 40.

Figure 27:
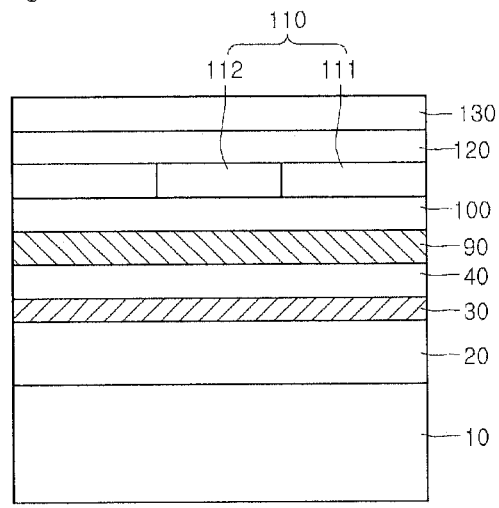

Referring to FIG. 27, the second electrode layer 110 including the reflective current spreading layer 111 and the current blocking layer 112 is formed over the current injection layer 100. In addition, the diffusion barrier layer 120 and the first wafer bonding layer 130 are formed over the second electrode layer 110.

Figure 28:
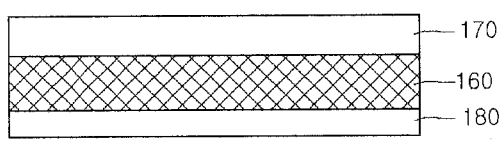

Referring to FIG. 28, the support substrate 160 is prepared, and the second wafer bonding layer 170 and a third wafer bonding layer 180 are formed at both lateral surfaces of the support substrate 160.

The third wafer bonding layer 180 may include the same material as that of the second wafer bonding layer 170

Figure 29:
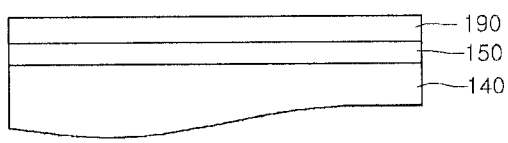

Referring to FIG. 29, the temporary substrate 140 is prepared, and the sacrificial separate layer 150 and a fourth wafer bonding layer 190 are formed over the temporary substrate 140.

The temporary substrate 140 may include a material having 70% or more of light transmittance with respect to a light having a wavelength of about 500 nm or less or a material making the difference of about 2 ppm/□ or less in a thermal expansion coefficient from the growth substrate 10. For example, the temporary substrate 140 may include one selected from the group consisting of $Al_2O_3$, SiC, GaN, InGaN, AlGaN, AlN, spinel, lithium niobate, neodymium gallate, and $Ga_2O_3$.

In order to separate the temporary substrate 140 by using a photon beam, the sacrificial separate layer 150 may include one selected from the group consisting of ZnO, GaN, InGaN, InN, ITO, AlInN, AlGaN, ZnInN, ZnGaN, and MgGaN. In order to separate the temporary substrate 140 by using a wet etch solution, the sacrificial separate layer 150 may include one selected from the group consisting of Au, Ag, Pd, $SiO_2$, and $SiN_x$.

The fourth wafer bonding layer 190 may include the same material as that of the third wafer bonding layer 180.

Figure 30:
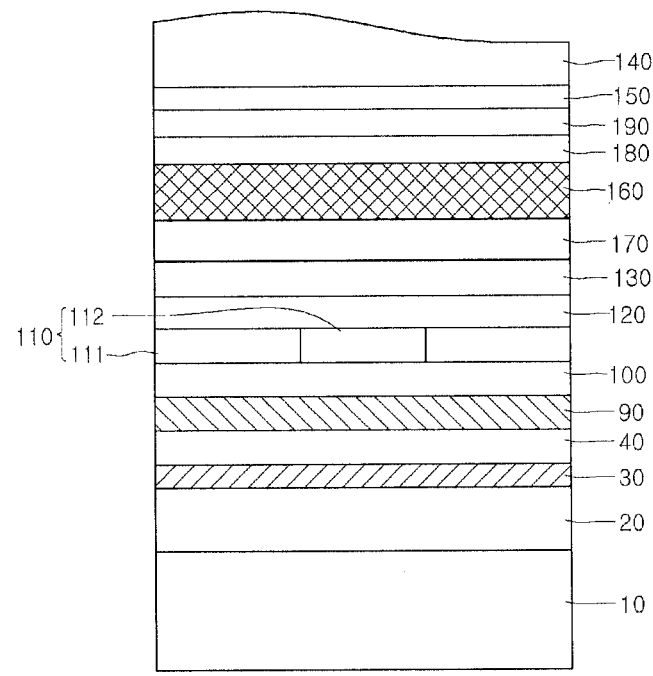

Referring to FIG. 30, the structures shown in FIGS. 27, 28, and 29 are bonded to each other through a wafer bonding process, thereby forming a complex structure.

In other words, the first wafer bonding layer 130 is bonded to the second wafer bonding layer 170, and the third wafer bonding layer 180 is bonded to the fourth wafer bonding layer 190.

Figure 31:
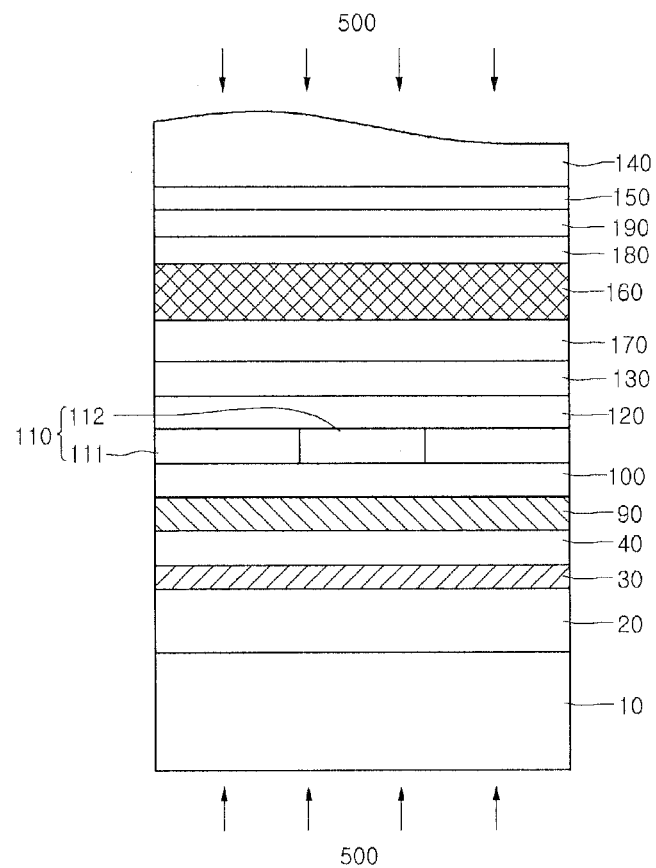

Referring to FIG. 31, the growth substrate 10 and the temporary substrate 140 are separated from the complex structure shown in FIG. 30.

For example, the growth substrate 10 and the temporary substrate 140 may be separated from the complex structure by irradiating the photon beam 500.

In this case, the sacrificial separate layer 150 is removed. After the sacrificial separate layer 150 has been removed, the third and fourth wafer bonding layers 180 and 190 are removed.

Figure 32:
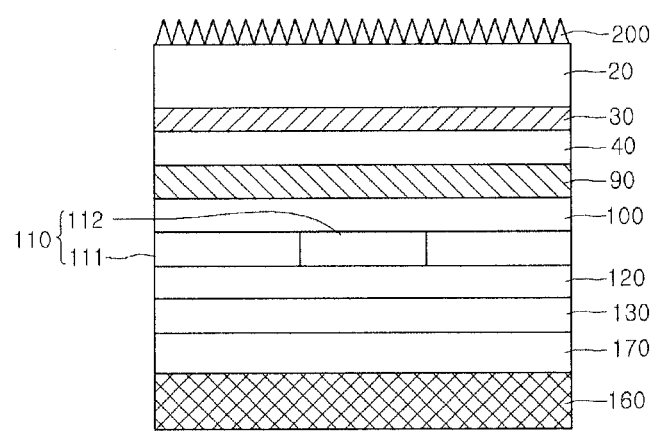

Referring to FIG. 32, after the growth substrate 10 has been removed, the light extracting structure layer 200 is formed over the first conductive semiconductor layer 20.

Figure 33:
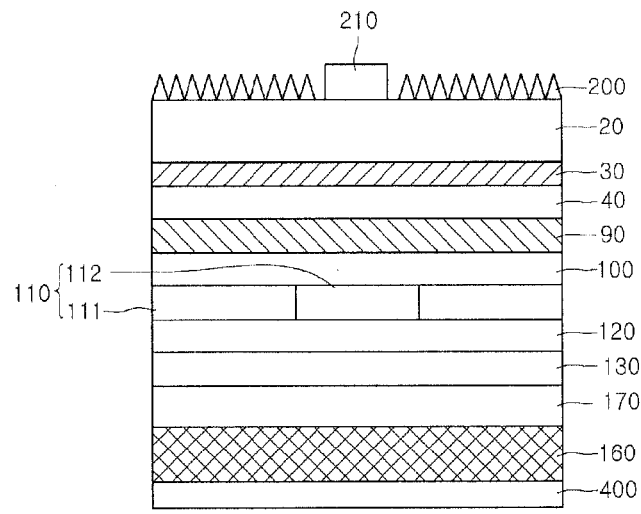

Referring to FIG. 33, the first electrode layer 210 is formed over the first conductive semiconductor layer 20. A second ohmic contact electrode layer 400 is formed under the support substrate 160.

Accordingly, the light emitting device according to the fifth embodiment can be manufactured as shown in FIG. 33.

Meanwhile, the method of manufacturing the light emitting device according to the sixth embodiment is similar to the method of manufacturing the light emitting device according to the fifth embodiment.

However, in FIG. 33, after the first ohmic contact electrode layer 220 has bee formed over the first conductive semiconductor layer 20 and the light extracting structure layer 200, the first electrode layer 210 is formed over the first ohmic contact electrode layer 220.

Figure 34:
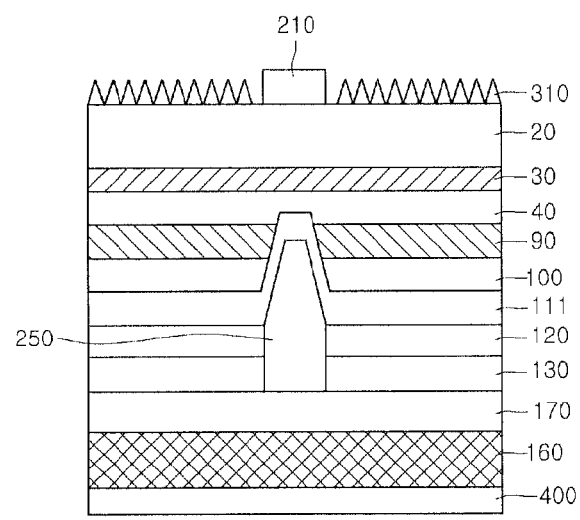
FIG. 34 is a sectional view showing a light emitting device according to a seventh embodiment.

FIG. 34 is a sectional view showing a light emitting device according to a seventh embodiment.

The light emitting device according to the seventh embodiment will be described while focusing over the difference from the third embodiment in order to avoid redundancy.

Referring to FIG. 34, the support substrate 160 is formed over the second ohmic contact electrode layer 400, and the second wafer bonding layer 170 is formed over the support substrate 160. In addition, the current blocking layer 250 and the first wafer bonding layer 130 are formed over the second wafer bonding layer 170. In addition, the diffusion barrier layer 120 is formed over the first wafer bonding layer 130.

The first wafer bonding layer 130 and the diffusion barrier layer 120 are provided at lateral surfaces of the current blocking layer 250.

The reflective current spreading layer 111 is formed over the diffusion barrier layer 120 and the current blocking layer 250, and the current injection layer 100 is partially formed over the reflective current spreading layer 111. The current injection layer 100 is arranged over the top surface and the lateral surface of the reflective current spreading layer 111.

The superlattice structure layer 90 is formed over the current injection layer 100. The superlattice structure layer 90 is provided at the lateral surface of the reflective current spreading layer 111.

The light emitting semiconductor layer including the second conductive semiconductor layer 40, the active layer 30, and the first conductive semiconductor layer 20 is formed over the superlattice structure layer 90 and the reflective current spreading layer 111.

In addition, the light extracting structure layer 200 and the first electrode layer 210 are formed over the first conductive semiconductor layer 20

Meanwhile, the current blocking layer 250 is formed over the second wafer bonding layer 170 while extending to the superlattice structure layer 90. The current blocking layer 250 vertically overlaps with the first electrode layer 210. For example, the current blocking layer 250 may include an electrical insulating material such as air, $SiN_x$, $SiO_2$, or $Al_2O_3$.

A portion of the reflective current spreading layer 111 is formed over the current blocking layer 250, passes through the superlattice structure layer 90, and makes contact with the second conductive semiconductor layer 40.

The reflective current spreading layer 111 forms a schottky contact interface with respect to the second conductive semiconductor layer 40 and the superlattice structure layer 90, and forms an ohmic contact interface with respect to the current injection layer 100. For example, the reflective current spreading layer 111 may include at least one of Al, Ag, Rh, Ti, Cr, V, Nb, TiN, Cu, Ta, Au, Pt, Pd, Ru, and metallic silicide.

The current blocking layer and the reflective current spreading layer 111 block a current applied from the outside from being concentrated over a specific region so that the current can spread widely, thereby increasing a light emitting area to increase light efficiency.

Figure 35:
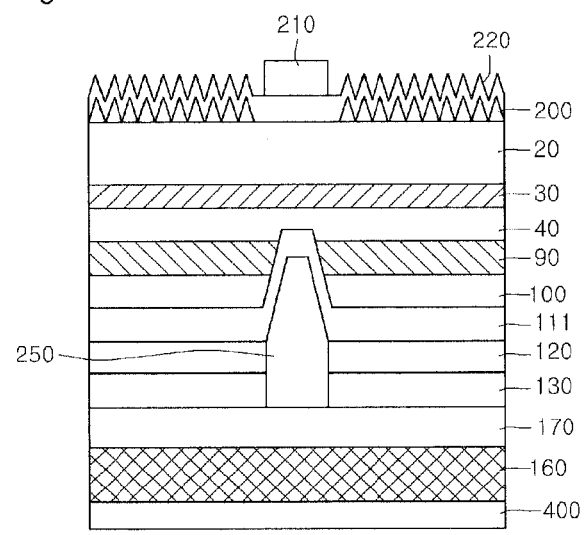
FIG. 35 is a sectional view showing a light emitting device according to an eighth embodiment.

FIG. 35 is a sectional view showing a light emitting device according to an eighth embodiment.

The light emitting device according to the eighth embodiment shown in FIG. 35 has a structure similar to that of the light emitting device according to the seventh embodiment. Accordingly, the light emitting device according to the eighth embodiment will be described while focusing over the difference from the seventh embodiment in order to avoid redundancy.

In the light emitting device according to the eighth embodiment, the first ohmic contact electrode layer 220 is formed over the first conductive semiconductor layer 20 and the light extracting structure layer 200, and the first electrode layer 210 is formed over the first ohmic contact electrode layer 220.

The first ohmic contact electrode layer 220 is provided over the top surface thereof with a concavo-convex structure so that the light emitted from the active layer 30 can be effectively extracted to the outside.

The first ohmic contact electrode layer 220 forms an ohmic contact interface with respect to the first conductive semiconductor layer 20 and has the 70% or more of the light transmittance with respect to the wavelength of about 600 nm or less.

For example, the first ohmic contact electrode layer 220 may include at least one selected from the group consisting of TiN, TiO, ITO, ZnO, $RuO_2$, $IrO_2$, $In_2O_3$, $SnO_2$, ZnGaO, InZnO, ZnInO, and Ni—O—Au.

FIGS. 36 to 44 are sectional views showing the method of manufacturing the light emitting device according to the seventh embodiment. The method of manufacturing the light emitting device according to the seventh embodiment will be described while focusing over the method of manufacturing the light emitting device according to the third embodiment in order to avoid redundancy.

Figure 36:
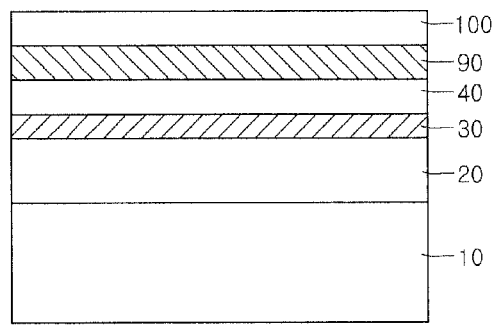
FIGS. 36 to 44 are sectional views showing a method of manufacturing the light emitting device according to the seventh embodiment.

Referring to FIG. 36, the light emitting semiconductor layer including the first conductive semiconductor layer 20, the active layer 30, and the second conductive semiconductor layer 40 is formed over the growth substrate 10. The superlattice structure layer 90 and the current injection layer 100 are formed over the second conductive semiconductor layer 40.

Figure 37:
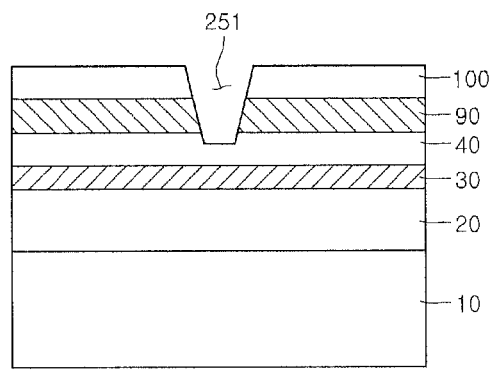

Referring to FIG. 37, the current injection layer 100, the superlattice structure layer 90, and the second conductive semiconductor layer 40 are selectively removed, thereby forming the groove part 251.

The second conductive semiconductor layer 40 is partially exposed through the groove part 251.

Figure 38:
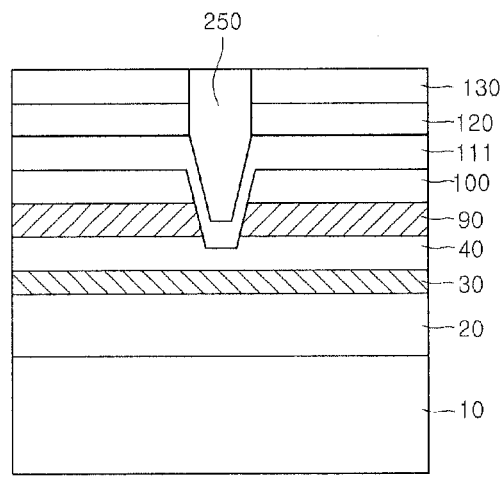

Referring to FIG. 38, the reflective current spreading layer 111 is formed over the current injection layer 100 including the groove part 251, and the diffusion barrier layer 120 and the first wafer bonding layer 130 are formed over the reflective current spreading layer 111 such that the groove part 251 is exposed.

The reflective current spreading layer 111 forms a schottky contact interface with respect to the second conductive semiconductor layer 40 and the superlattice structure layer 90, and forms an ohmic contact interface with respect to the current injection layer 100.

The current blocking layer 250 is formed in the groove part 251.

Figure 39:
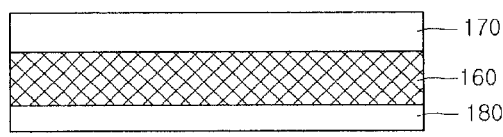

Referring to FIG. 39 the support substrate 160 is prepared, and the second wafer bonding layer 170 and the third wafer bonding layer 180 are formed at both lateral surfaces of the support substrate 160.

Figure 40:
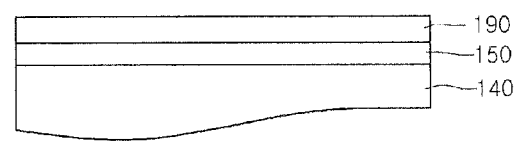

Referring to FIG. 40, the temporary substrate 140 is prepared, and the sacrificial separate layer 150 and the fourth wafer bonding layer 190 are formed over the temporary substrate 140.

Figure 41:
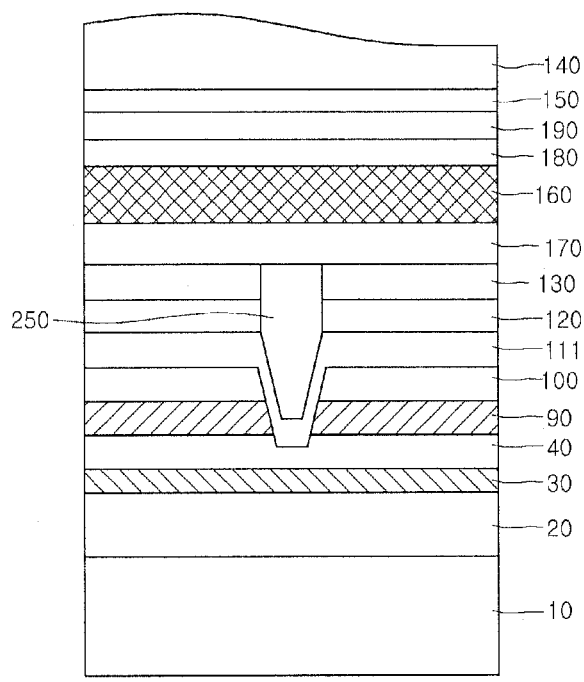

Referring to FIG. 41, the structures shown in FIGS. 38, 39, and 40 are bonded to each other through a wafer bonding process, thereby forming a complex structure.

In other words, the first wafer bonding layer 130 is bonded to the second wafer bonding layer 170, and the third wafer bonding layer 180 is bonded to the fourth wafer bonding layer 190.

Figure 42:
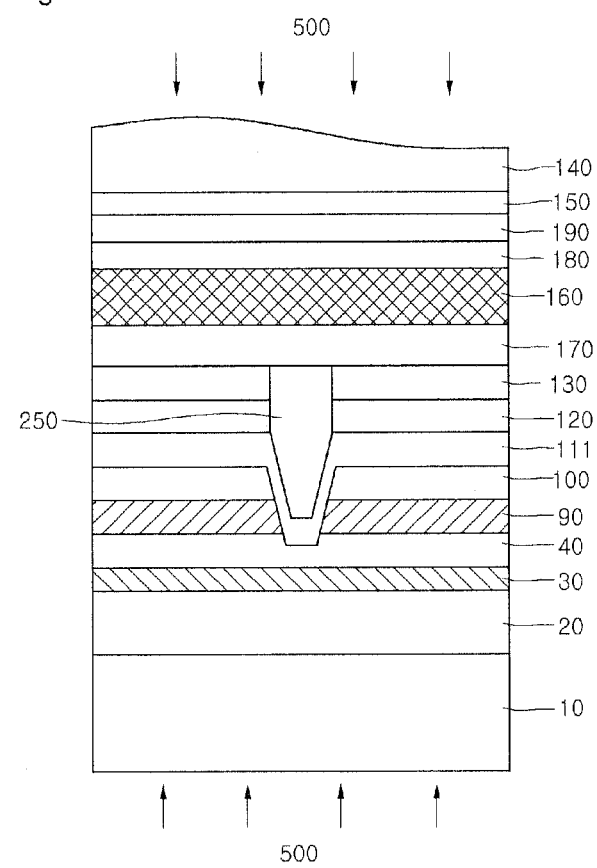

Referring to FIG. 42, the growth substrate 10 and the temporary substrate 140 are separated from the complex structure shown in FIG. 41.

For example, the growth substrate 10 and the temporary substrate 140 may be separated from the complex structure by irradiating the photon beam 500.

In this case, the sacrificial separate layer 150 is removed. After the sacrificial separate layer 150 has been removed, the third and fourth wafer bonding layers 180 and 190 are removed.

Figure 43:
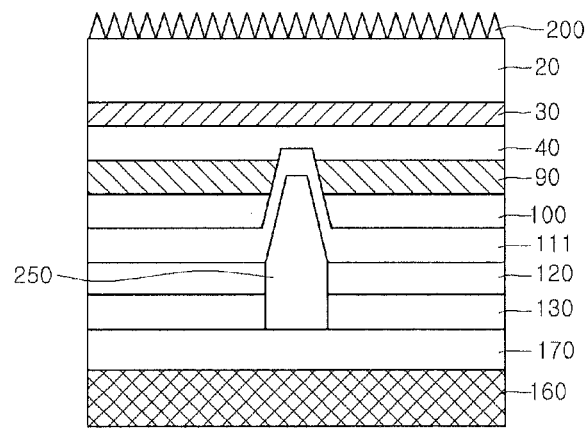

Referring to FIG. 43, after the growth substrate 10 has been removed, the light extracting structure layer 200 is formed over the first conductive semiconductor layer 20.

Figure 44:
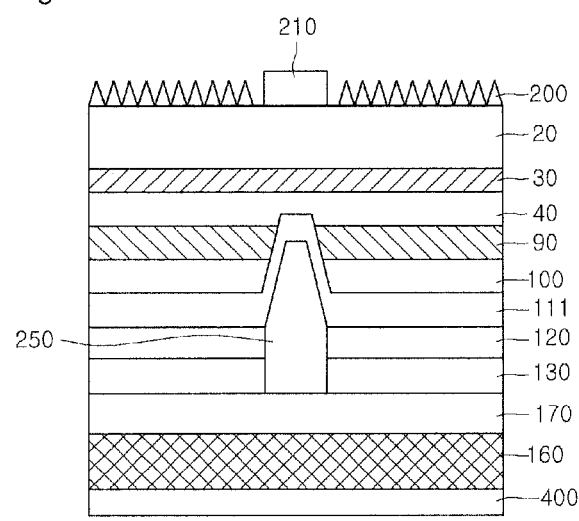

Referring to FIG. 44, the first electrode layer 210 is formed over the first conductive semiconductor layer 20. Then, the second ohmic contact electrode layer 400 is formed under the support substrate 160.

Therefore, as shown in FIG. 44, the light emitting device according to the seventh embodiment can be manufactured.

Meanwhile, a method of manufacturing the light emitting device according to the eighth embodiment is similar to the method of manufacturing the light emitting device according to the seventh embodiment.

However, in FIG. 44, after the first ohmic contact electrode layer 220 has bee formed over the first conductive semiconductor layer 20 and the light extracting structure layer 200, the first electrode layer 210 is formed over the first ohmic contact electrode layer 220.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

[Industrial Applicability]

The embodiment is applicable to a light emitting device used as a light source.

The invention claimed is:

1. A light emitting device comprising:
a support substrate;
a wafer bonding layer over the support substrate;
a second electrode layer including a current blocking layer and a reflective current spreading layer over the wafer bonding layer;
a current injection layer over the second electrode layer;
a superlattice structure layer over the current injection layer;
a second conductive semiconductor layer over the superlattice structure layer;
an active layer over the second conductive semiconductor layer;
a first conductive semiconductor layer over the active layer;
a light extracting structure layer on the first conductive semiconductor layer, wherein the light extracting structure layer is formed in a concavo-convex structure and a central region of a surface of the first conductive semiconductor layer is exposed;
a first ohmic contact electrode layer on the light extracting structure layer and on the surface of the first conductive semiconductor layer in the central region, wherein the first ohmic contact electrode layer corresponding to the light extracting structure layer is formed in a concavo-convex structure; and
a first electrode layer on a flat surface of the first ohmic contact electrode layer corresponding to the central region.

2. The light emitting device of claim 1, further comprising a diffusion barrier layer between the wafer bonding layer and the second electrode layer.

3. The light emitting device of claim 2, wherein the diffusion barrier layer includes at least one selected from the group consisting of Pt, Pd, Cu, Rh, Re, Ti, W, Cr, Ni, Si, Ta, TiW, TiNi, NiCr, TiN, WN, CrN, TaN, TiWN, and metallic silicide.

4. The light emitting device of claim 1, further comprising a second ohmic contact electrode layer under the support substrate.

5. The light emitting device of claim 1, wherein the first electrode layer vertically overlaps the current blocking layer.

6. The light emitting device of claim 1, wherein the wafer bonding layer includes at least one selected from the group consisting of Au, Ag, Al, Rh, Cu, Ni, Ti, Pd, Pt, Cr, and metallic silicide.

7. The light emitting device of claim 1, wherein the current blocking layer includes a thin film layer forming a schottky contact interface with respect to an electrical insulating thin film layer or the current injection layer.

8. The light emitting device of claim 7, wherein the current blocking layer includes one selected from the group consisting of $SiN_x$, $SiO_2$, $Al_2O_3$, Al, Ag, Rh, Ti, Cr, V, Nb, TiN, Cu, Ta, Au, Pt, Pd, Ru, and metallic silicide.

9. The light emitting device of claim 1, wherein the current injection layer includes a conductive thin film including a nitride or a carbon nitride including group II, III, or IV elements.

10. The light emitting device of claim 1, wherein the superlattice structure layer includes at least one selected from the group consisting of InN, InGaN, InAlN, AlGaN, GaN, AlInGaN, AlN, SiC, SiCN, MgN, ZnN, and SiN.

11. The light emitting device of claim 1, wherein the first ohmic contact electrode layer includes at least one selected from the group consisting of TiN, TiO, ITO, ZnO, $RuO_2$, $IrO_2$, $In_2O_3$, $SnO_2$, ZnGaO, InZnO, ZnInO, and Ni—O—Au.

12. A light emitting device comprising:
a support substrate;
a wafer bonding layer over the support substrate;
a current blocking layer partially formed over the wafer bonding layer;
a reflective current spreading layer over the wafer bonding layer and the current blocking layer;
a current injection layer provided over a top surface and a lateral surface of the reflective current spreading layer;
a superlattice structure layer over a top surface and a lateral surface of the current injection layer;

a second conductive semiconductor layer over the superlattice structure layer and the reflective current spreading layer;

an active layer over the second conductive semiconductor layer;

a first conductive semiconductor layer over the active layer;

a first electrode layer over the first conductive semiconductor layer; and a light extracting structure layer on the first conductive semiconductor in a periphery region of the first electrode layer, wherein the light extracting structure layer is formed in a concavo-convex structure, and wherein the reflective current spreading layer contacts a top surface and a lateral surface of the current blocking layer.

13. The light emitting device of claim 12, further comprising a diffusion barrier layer between the wafer bonding layer and the reflective current spreading layer, wherein the diffusion barrier layer is provided at a lateral surface of the current blocking layer.

14. The light emitting device of claim 12, wherein the reflective current spreading layer forms a schottky contact interface with respect to the second conductive semiconductor layer.

15. The light emitting device of claim 12, wherein the current injection layer includes a conductive thin film including a nitride or a carbon nitride including group II, III, or IV elements.

16. The light emitting device of claim 12, wherein the superlattice structure layer includes at least one selected from the group consisting of InN, InGaN, InAlN, AlGaN, GaN, AlInGaN, AlN, SiC, SiCN, MgN, ZnN, and SiN.

17. The light emitting device of claim 12, further comprising a first ohmic contact electrode layer between the light extracting structure layer and the first electrode layer.

18. The light emitting device of claim 17, wherein the first ohmic contact electrode layer contacts the light extracting structure layer and the first conductive semiconductor in an exposed region corresponding with the first electrode layer.

19. The light emitting device of claim 17, wherein the first electrode layer contacts the first ohmic contact electrode layer.

20. A light emitting device comprising:

a substrate;

a wafer bonding layer on the substrate;

a second electrode layer including a current blocking layer and a reflective current spreading layer on the wafer bonding layer;

a current injection layer on the second electrode layer;

a superlattice structure layer on the current injection layer;

a second conductive semiconductor layer on the superlattice structure layer;

an active layer on the second conductive semiconductor layer;

a first conductive semiconductor layer on the active layer, the first conductive semiconductor layer having a first portion and a second portion on a top surface of the first conductive semiconductor layer;

a light extracting structure layer on the first portion of the first conductive semiconductor layer while the second portion of the first conductive semiconductor layer is exposed, and wherein the light extracting structure layer on the first portion of the first conductive semiconductor layer is a concavo-convex structure;

a first ohmic contact electrode layer having a concavo-convex structure on the light extracting structure and having a flat surface at an area corresponding to the second portion of the first conductive semiconductor layer; and a first electrode layer on the flat surface of the first ohmic contact electrode layer.

* * * * *